(12) United States Patent
Kazama et al.

(10) Patent No.: US 7,053,635 B2
(45) Date of Patent: May 30, 2006

(54) SUPPORT MEMBER ASSEMBLY FOR ELECTROCONDUCTIVE CONTACT MEMBERS

(75) Inventors: Toshio Kazama, Nagano (JP); Shogo Imuta, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 10/472,315

(22) PCT Filed: Mar. 15, 2002

(86) PCT No.: PCT/JP02/02497

§ 371 (c)(1),
(2), (4) Date: Apr. 2, 2004

(87) PCT Pub. No.: WO02/075329

PCT Pub. Date: Sep. 26, 2002

(65) Prior Publication Data

US 2004/0157475 A1     Aug. 12, 2004

(30) Foreign Application Priority Data

Mar. 16, 2001    (JP)   ............................ 2001-076833
Aug. 10, 2001    (JP)   ............................ 2001-244702

(51) Int. Cl.
    *G01R 31/26*      (2006.01)
(52) U.S. Cl. ........................................ 324/754; 324/755
(58) Field of Classification Search ........ 324/754–762; 439/480–482, 54
See application file for complete search history.

(56) References Cited

U.S. PATENT DOCUMENTS 4,311,352 A    1/1982    Kochsmeier .............. 339/18 R
4,763,641 A *    8/1988    Smith ........................ 126/672
6,097,089 A *    8/2000    Gaku et al. ................. 257/712
6,556,033 B1 *    4/2003    Kazama ..................... 324/761

FOREIGN PATENT DOCUMENTS

| EP | 0 995 996 A1 | 4/2000 |
| EP | 1 113 274 A1 | 7/2001 |
| JP | 2001-223247 | 8/2001 |
| JP | 2002-139513 | 5/2002 |

OTHER PUBLICATIONS

English Language Abstract, Japanese Patent No. JP2001-223247, Published Aug. 17, 2001.
English Language Abstract, Japanese Patent No. JP2002139513, Published May 17, 2002.

* cited by examiner

*Primary Examiner*—Vinh P. Nguyen
(74) *Attorney, Agent, or Firm*—MacPherson Kwok Chen & Heid LLP

(57) ABSTRACT

The support member assembly 1 is formed by laminating a plurality of plastic layered assemblies 6 each incorporated with a reinforcing plate 3 and integrally joining them by heating. Holder holes 2 are formed in the parts of the assembly corresponding to the openings 3a of the reinforcing plates 3. The reinforcing member increases the overall mechanical strength of the support member assembly. Furthermore, because a number of reinforcing plates can be layered and each reinforcing plate may be provided with a small thickness, the working of the strips of the reinforcing plates between adjacent openings can be achieved without any difficulty, and the manufacturing cost of such a support member assembly can be reduced. When each plastic layered assembly comprises plastic material formed by impregnating non-woven fabric with thermosetting resin, the drilling of holder holes for receiving electroconductive contact members can be more favorably and economically performed.

12 Claims, 7 Drawing Sheets

SUPPORT MEMBER ASSEMBLY FOR ELECTROCONDUCTIVE CONTACT MEMBERS

This application is a 371 of PCT/JP02/02497 filed on Mar. 15, 2002.

TECHNICAL FIELD

The present invention relates to a support member assembly for electroconductive contact members used for testing semiconductor devices and other related products, and in particular to a support member assembly for electroconductive contact members suitable for burn-in tests.

BACKGROUND OF THE INVENTION

In recent years, burn-in tests are routinely conducted as a part of a test process for semiconductor related components, and in such a test a voltage is applied to an object for a prolonged period of time (from few hours to tens of hours) at an elevated temperature (approximately 150° C.). It is more and more preferred to conduct such a test on a wafer level (8 inch or 200 mm wafer) rather than on a package level so that the yield factor may be improved. At any event, when applying a contact probe head for simultaneously accessing a large number of points during a burn-in test, the heat resistance and thermal expansion of the support member for electroconductive contact members are important factors that need to be taken into account.

The conductive contact members are each desired to be able to accommodate variations in the height of the corresponding electrode on the wafer by resiliently engaging such an electrode. Such an example is illustrated in FIG. 12. Referring to FIG. 12, a plurality of stepped holder holes 2 are passed across the thickness of a support member 21 in the form of a plate member. A small diameter section 2a of each holder hole 2 slidably receives a conductive needle member 23, and a large diameter section 2b of the holder hole 2 receives a conductive coil spring 24. The electroconductive contact member 23 includes a radial flange 23a which is received in the large diameter section 2b, and is resiliently urged by the coil spring 24 having one end wound around a stem portion 23b extending from the flange 23a. The other end of the coil spring 24 resiliently engages a corresponding terminal 25a of a circuit board 25 which is placed over the support member 21. The terminal 25a is connected to an electric circuit of a tester not shown in the drawing.

A number of such electroconductive contact members 23 are arranged in parallel to each other in the support member 21 as illustrated in FIG. 12 to form a contact probe head capable of accessing a plurality of points at the same time. An electric test is conducted by pushing pointed free ends of such electroconductive contact members 23 onto the electrodes 26a of a wafer 26 (object to be tested) in a resilient manner.

To allow a plurality of electrodes 26a on the wafer 26 to be accessed at the same time as mentioned above, it is necessary to arrange in the support member 21 the same number of conductive contact members 23 as the number of the electrodes 26a on the wafer 26, and the support member 21 is required to be formed with a large number of holder holes 2 in a precise manner. Furthermore, because an elevated temperature in the order of 125 to 150° C. is maintained for tens of hours in a burn-in test, the contact probe head is required to be provided with a corresponding heat resistance and low thermal expansion coefficient.

The materials having a heat resistance and thermal expansion coefficient comparable to that of silicon serving as the material for a wafer include ceramics, glass and low thermal expansion alloys such as invar as well as silicon. However, machining a silicon member is a time-consuming process, and silicon requires electric insulation. Ceramics are known to be difficult to machine. Glass involves significant dimensional errors when machining, and this results in a poor yield factor. A low thermal expansion alloy is difficult to machine, and requires electric insulation. Therefore, when such materials are selected for the support member of a contact probe head, the production efficiency is low, and the production cost is high.

Plastic material suited for precision machining is suitable as the material for the support member. However, in a contact probe head having a large number of conductive contact members arranged in the support member at a high density, the pressure produced from such a large number of conductive contact members may cause a warping of the support member. The thermal expansion may cause positional errors of the conductive contact members, and the access point of each conductive contact member may unacceptably offset from the desired point.

The tests of semiconductor devices and related components are not necessarily performed under an elevated temperature, but are also performed under intermediate temperatures such as about 80° C., low temperatures and room temperatures.

At any event, particularly in the case of testing a patterned surface of a silicon wafer in a wafer level test, it is important not only to simultaneously contact a large number of points uniformly but also to position each of the electroconductive contact members in a highly precise manner. Thus, for various testing purposes, it is desired to provide a highly precise support member assembly for electroconductive contact members which is free from positioning errors.

BRIEF SUMMARY OF THE INVENTION

In view of such problems of the prior art, a primary object of the present invention is to provide a support member assembly for electroconductive contact members for simultaneously accessing a plurality of points which is highly precise and economical at the same time.

A second object of the present invention is to provide a support member assembly for electroconductive contact members for simultaneously accessing a plurality of points which is suitable for wafer level tests.

A third object of the present invention is to provide a support member assembly for electroconductive contact members for simultaneously accessing a plurality of points which is suitable for burn-in tests of semiconductor devices and related components including semiconductor wafers.

A fourth object of the present invention is to provide a support member assembly for electroconductive contact members for simultaneously accessing a plurality of points which is minimized in cost while meeting the necessary performance of the given test condition.

A fifth object of the present invention is to provide a method for making such a support member assembly for electroconductive contact members for simultaneously accessing a plurality of points.

To achieve such objects, the present invention provides a support member assembly for supporting a plurality of electroconductive contact members for accessing an object to be contacted in a mutually parallel relationship, comprising: a plastic plate member; and a plurality of reinforcing plates incorporated in the plate member one over another and each provided with at least one opening which registers with an opening of an adjacent one of the reinforcing plates; part of the plastic plate member corresponding to the openings of the reinforcing plates being formed with holder holes for receiving the electroconductive contact members extending across the thickness thereof. Preferably, the reinforcing plates are at least partly buried within the plastic plate member.

The support member assembly may be formed by laminating a plurality of plastic layered assemblies each incorporated with a reinforcing plate so that each plastic layered assembly may consist of a thin plate member. Thereby, the dimensional precision of the laminated assembly can be achieved by controlling the dimensional precision of each plastic layered assembly. A desired thickness can be achieved by laminating a necessary number of plastic layered assemblies. In this case, the reinforcing plates may either spaced from each other or closely placed one over another.

In particular, the plastic plate member is preferably prepared by heating and/or pressurizing nonwoven fabric impregnated with resin material and forming the assembly into a desired shape. By so doing, a plastic plate member suitable for forming holes at a high precision can be prepared at a low cost. The nonwoven fabric preferably comprises short and fine glass fibers, and the resin material preferably consists of thermosetting resin material.

According to a preferred embodiment of the present invention, there is provided a support member assembly for supporting a plurality of electroconductive contact members for accessing an object to be contacted in a mutually parallel relationship, comprising: a plastic plate member made of a first plastic material and formed with holder holes for receiving electroconductive contact members extending across the thickness thereof; and an annular reinforcing member made of a second plastic material different from the first plastic material and bonded to an outer periphery of the plastic plate member.

Thus, a plastic plate member suitable for forming holes both precisely and economically can be used while the annular reinforcing member provides an adequate mechanical strength and heat resistance to the assembly.

The present invention also provides a method for making a support member assembly for supporting a plurality of electroconductive contact members for accessing an object to be contacted in a mutually parallel relationship, comprising the steps of: preparing a reinforcing plate having at least one opening therein; placing at least one sheet of plastic material over the reinforcing plate; applying heat and/or pressure to a layered assembly of the reinforcing plate and the plastic sheet to integrally join the reinforcing plate and plastic sheet to each other; laminating the layered assembly with at least one plastic plate to thereby form a laminated assembly; and forming holder holes for receiving electroconductive contact members in a part of the laminated assembly corresponding to the opening of the reinforcing plate across the thickness of the laminated assembly.

This allows such a favorable support member assembly both easily and economically.

The reinforcing member may be made of not only metallic materials but also ceramic materials, glass or plastic materials such as LCP (liquid crystal polymer), PES (polyether-sulfon), PEI (polyether-imide), PPS (polyphenylene-sulfide) and PAI (polyamide-imide) plastic materials. The material suitable for forming the holder holes include PPS (polyphenylene-sulfide), LCP (liquid crystal polymer), PES (polyether-sulfon) and PEI (polyether-imide). By combining such materials, it is possible to achieve an optimum combination of materials for the support member assembly depending on the particular surrounding temperature (from room temperature to 150° C.) and pitch of the electroconductive contact members (required precision).

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
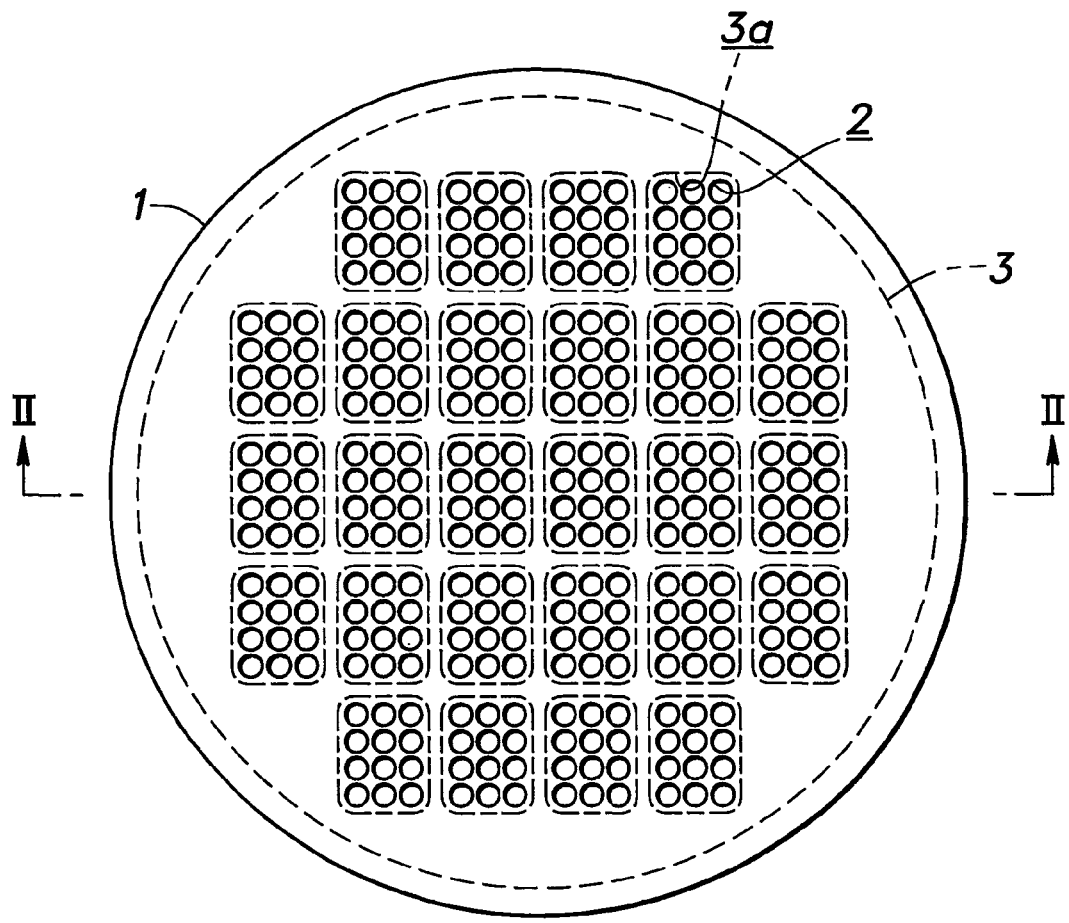
FIG. 1 is a plan view of a support member assembly for use in an electroconductive contact head embodying the present invention.
Figure 2:
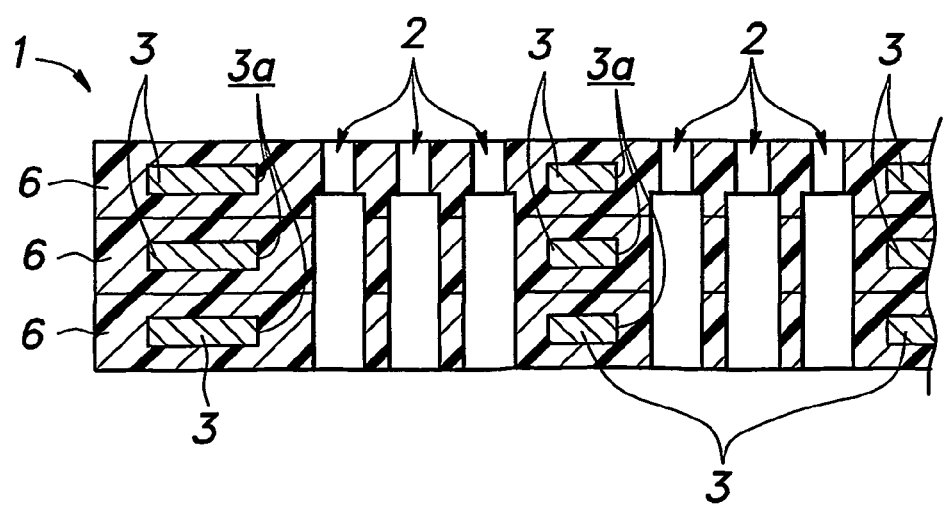
FIG. 2 is a fragmentary sectional side view taken along line II—II of FIG. 1.

FIG. 1 is a plan view of the support member assembly for an electroconductive contact head embodying the present invention, and FIG. 2 is an enlarged fragmentary sectional side view taken along line II—II of FIG. 1. The electroconductive contact members and coil springs combined with the support member assembly are omitted from the drawings because they may be conventional in structure.

When the object to be tested consists of an 8-inch wafer, the support member assembly may have the shape of a circular plate having a diameter in the order of 8 inches (approximately 200 mm) as shown in the drawing. In the case of an 8-inch wafer, it may contain tens to hundreds of semiconductor chips. In the case of a 12-inch wafer, thousands of semiconductor chips are included in the wafer.

As shown in FIGS. 1 and 2, the support member assembly is provided with a plurality of holder holes 2 for electroconductive contact members so as to correspond to the electrodes of the chips formed in the wafer (not shown in the drawings) serving as the object to be contacted. The holder holes 2 may be each provided with a conventional shape. As shown in FIG. 1, the holder holes 2 are grouped into each chip, and a reinforcing plate 3 generally having the shape of a circular plate and provided with openings 3a each exposing such a group of support holes 2 is incorporated and buried in the support assembly 1 and extends to a part adjacent to the outer periphery of the support member assembly.

In this electroconductive contact head, the reinforcing plate 3 may consist of a plate member made of a heat resistant and low thermal expansion alloy such as Invar and Kovar and formed with openings 3a corresponding to the chips by etching, stamp forming, laser machining or other mechanical processes. As shown in FIG. 2, the reinforcing plate 3 is incorporated in each of a plurality (three, in the illustrated embodiment) of plastic layered assemblies 6 which are laid one over another so as to jointly form the support member assembly 1, and holder holes 2 are formed in the plastic members which fill the openings 3a to provide parts where holder holes 2 are to be formed.

The material for such plastic members may be selected from such plastic materials as PPS (polyphenylene-sulfide), LCP (liquid crystal polymer), PES (polyether-sulfon) and PEI (polyether-imide) which are easy to machine and provide a high level of precision. Therefore, holder holes 2 can be formed at a high density and precision suitable for wafer-level tests.

The plastic material may also consist of prepreg or fiber glass reinforced plastic material. Prepreg provides a high rigidity, high strength, lower thermal expansion and extended service life. Glass fiber reinforced plastic is highly resistant to heat, pressure and corrosion. Glass fiber reinforced plastic may consist of a mixture of fine glass rods and plastic material, and may consist of glass epoxy resin. When prepreg or fiber glass reinforced plastic material is used, owing to the reduced elongation of the material, the precision in the pitch of the holder holes 2 can be ensured even when a significant change in the environment takes place, and this is particularly favorable for wafer-level burn-in tests.

Figure 3:
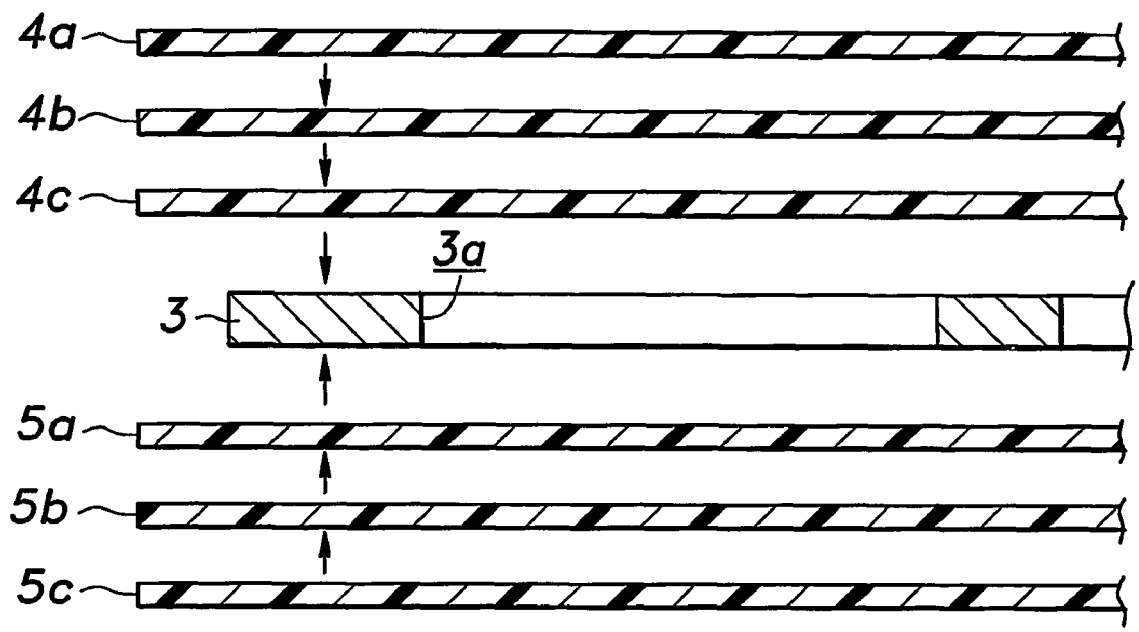
FIG. 3 is an enlarged fragmentary sectional side view showing the mode of preparing the plastic layered assembly.
Figure 4:
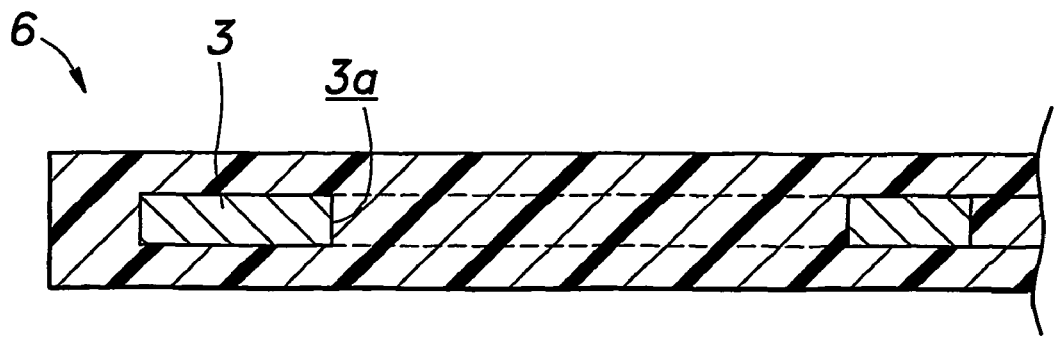
FIG. 4 is an enlarged fragmentary sectional side view showing the plastic layered assembly.

The mode of forming the support member assembly 1 is described in the following with reference to FIGS. 3 to 6. Referring to FIG. 3, three thin plastic sheets 4a, 4b and 4c; 5a, 5b and 5c (each having a thickness of 0.18 mm, for instance) are layered over each side of a reinforcing plate 3 having a thickness of 0.15 to 0.5 mm as indicated by arrows. The layered assembly is then heated and pressurized so that the reinforcing plate 3 is insert molded within the plastic material to form an integral plastic layered assembly 6 as shown in FIG. 4.

The plastic sheets 4a, 4b and 4c; 5a, 5b and 5c may consist of prepreg, glass fiber reinforced resin or plastic material incorporated with nonwoven fabric as mentioned earlier. In this case, by using a relatively fine glass fibers, the thickness of each plastic sheet 4a, 4b and 4c; 5a, 5b and 5c may be reduced, and molded at a higher precision without difficulty. Finer glass fibers allow the density of the glass fibers in the prepreg or glass fiber reinforced resin to be increased, and the resulting reduction in the gaps between the glass fibers reduces the density of the plastic material so that the thermal expansion can be favorably controlled. In the finished plastic layered assembly 6, as a result of the heating and pressurization, a part of the material of the plastic sheets 4a, 4b and 4c; 5a, 5b and 5c melts and fills the openings 3a of the reinforcing plate 3.

Figure 5:
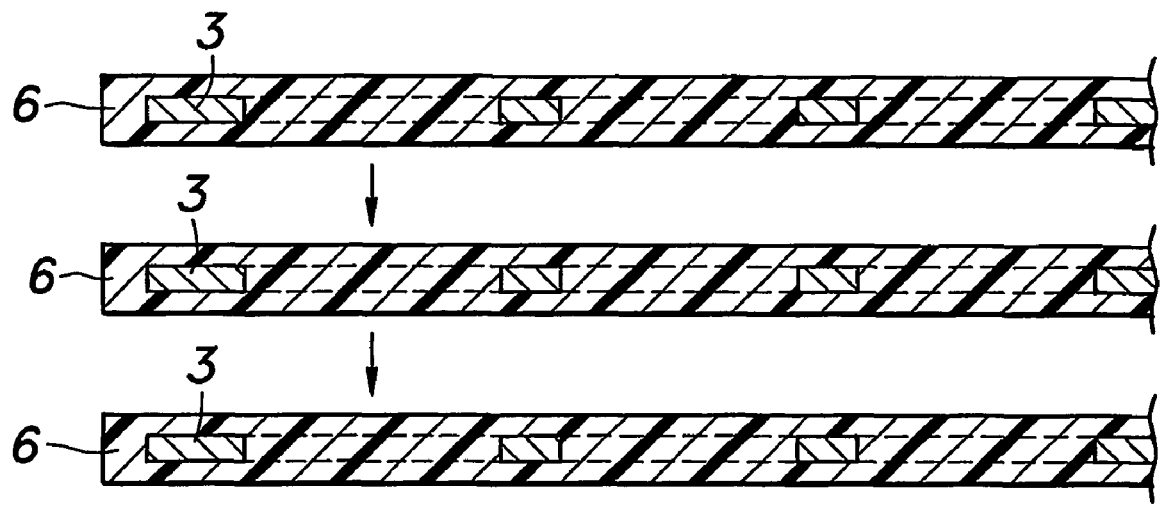
FIG. 5 is an enlarged fragmentary sectional side view showing the mode of preparing the support member assembly
Figure 6:
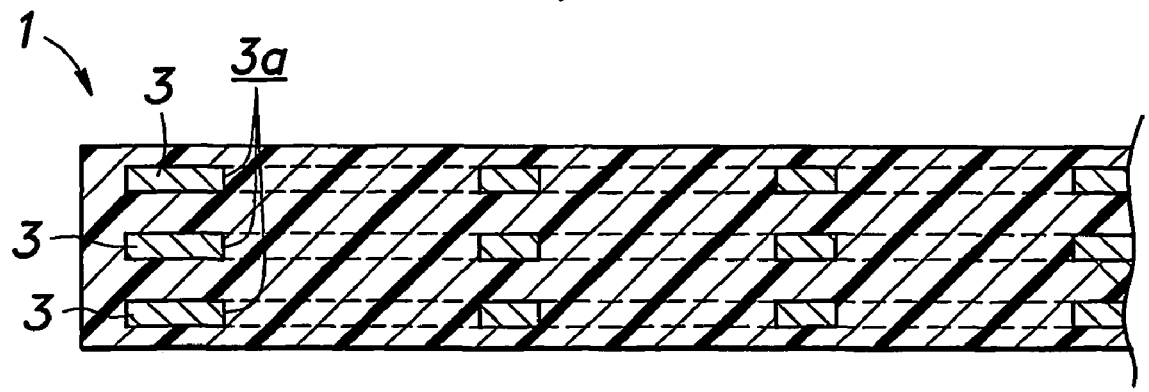
FIG. 6 is an enlarged fragmentary sectional side view showing the support member assembly before forming the holder holes.

For instance, three plastic layered assemblies 6 prepared in such a manner are placed one over another as shown in FIG. 5, and are joined into one piece by bonding or heating into a plastic laminated assembly as shown in FIG. 6. Holder holes 2 are formed in the parts of the assembly corresponding to the openings 3a, and the support member assembly 1 as shown in FIG. 2 is finally formed.

By thus forming the support member assembly 1, the dimensional precision of each plastic layered assembly 6 can be improved over the case where the support member assembly is prepared by machining a single solid plate member. The dimensions of the finished assembly 1 can be controlled at a high precision without any difficulty. Because the reinforcing plate 3 prevents the thermal deformation of the support member assembly 1, it is highly suitable for use as the support member assembly of an electroconductive contact head for wafer-level burn-in tests. The manufacturing cost can be reduced and a better cost performance can be achieved in terms of dimensional precision as compared to the case where holder holes are formed in a solid member made of such materials as silicon, invar, and other low thermal expansion metals.

Figure 7:
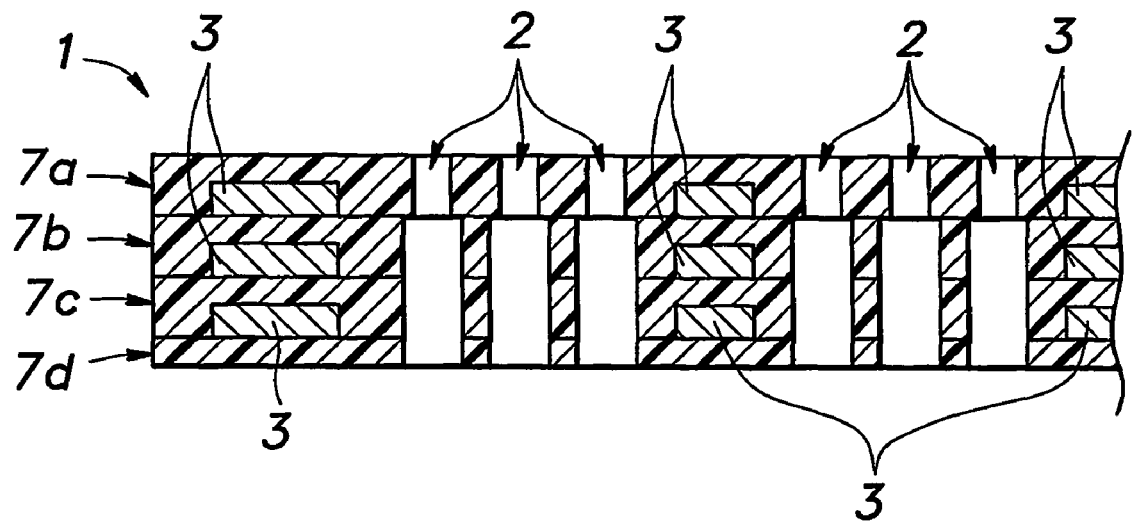
FIG. 7 is an enlarged fragmentary sectional side view of a second embodiment of the support member assembly.

FIG. 7 shows a second embodiment of the present invention. In FIG. 7, the parts corresponding to those of the previous embodiment are denoted with like numerals without repeating the description of such parts. According to the second embodiment, three plastic layered assemblies 7a, 7b and 7c each incorporated with a reinforcing plate 3 having one side thereof (lower side as shown in the drawing) exposed and a plastic layered assembly 7d consisting of a single plastic plate covering the exposed surface of the lower most plastic layered assembly 7c are joined integrally to one another (by insert molding or the like) to form a support member assembly 1 similar to that of the first embodiment. This embodiment also provides similar advantages.

Figure 8:
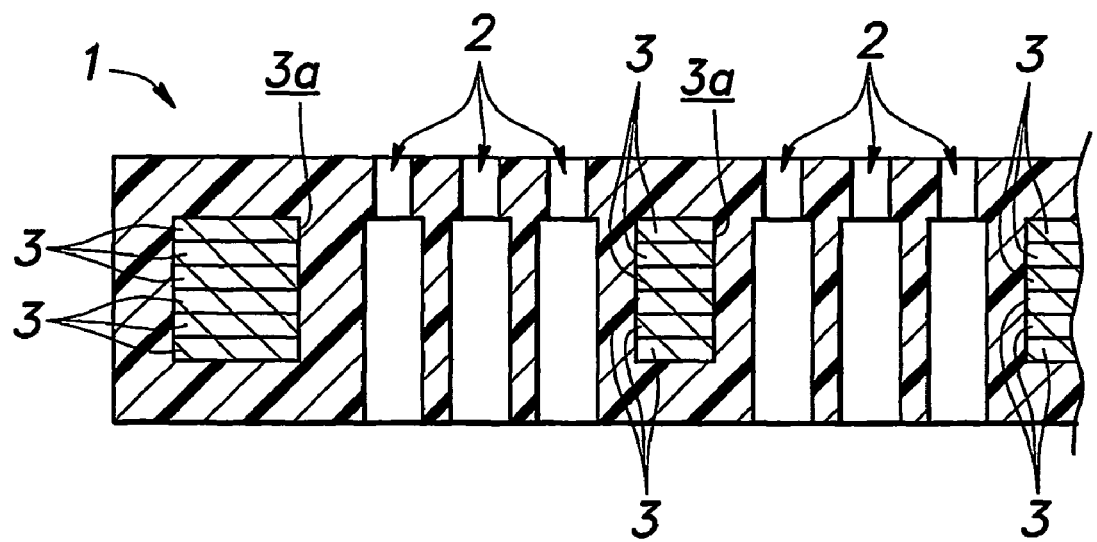
FIG. 8 is an enlarged fragmentary sectional side view of a third embodiment of the support member assembly.

FIG. 8 shows a third embodiment of the present invention. In FIG. 8 also, the parts corresponding to those of the previous embodiment are denoted with like numerals without repeating the description of such parts. According to the third embodiment, for instance, five reinforcing plates 3 are placed one over another in mutual contact, and a plurality of plastic sheets are laminated over each side of the assembly of the five reinforcing plates 3 and integrally joined to each other by applying heat and/or pressure. In this case, because each reinforcing plate 3 can be made thinner than that of the previous embodiment, this embodiment can be favorably applied to a case where the strips between adjacent openings are narrow and would be difficult to form if the thickness of the reinforcing plate is great.

Figure 9:
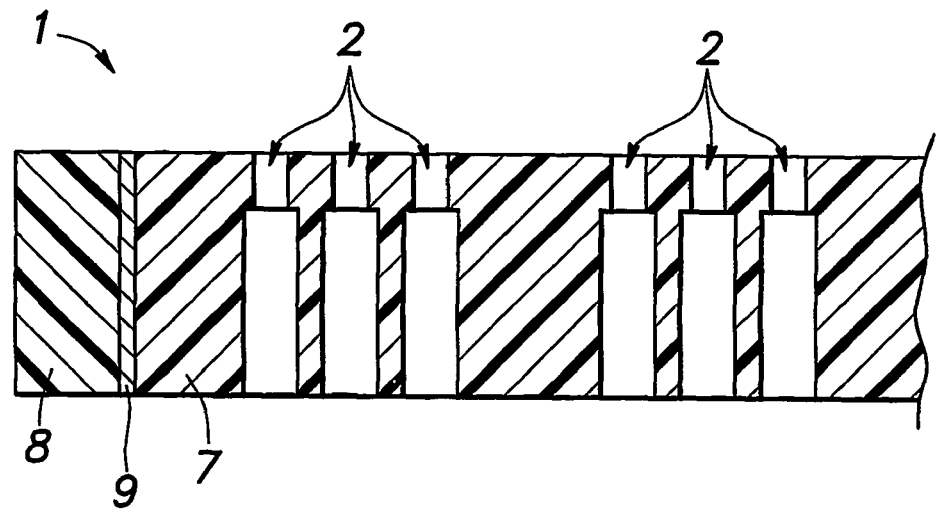
FIG. 9 is an enlarged fragmentary sectional side view of a fourth embodiment of the support member assembly.

FIG. 9 shown a fourth embodiment of the present invention. According to the support member assembly of the fourth embodiment, the part for forming holder holes 2 consists of a plastic plate member 7 having a relatively large thickness, and an annular reinforcing member 8 surrounding the plastic plate member 7 is fixedly attached to the outer periphery of the plastic plate member 7 by using a heat resistant bonding agent 9. By so doing, the need for insert molding the reinforcing plate 3 in the plastic plate member 7 is eliminated, and the machining is simplified while the manufacturing cost is minimized at the same time. Because the reinforcing member 8 is fixedly attached to the plastic plate member 7 by using a bonding agent 9, the manufacturing process is simplified, and the manufacturing cost is reduced. In stead of using a bonding agent, it is also possible to fixedly attach the annular reinforcing member 8 to the plastic plate member 7 by thermal or ultrasonic welding, press fitting or using a suitable fastener such as threaded bolts.

Figure 10:
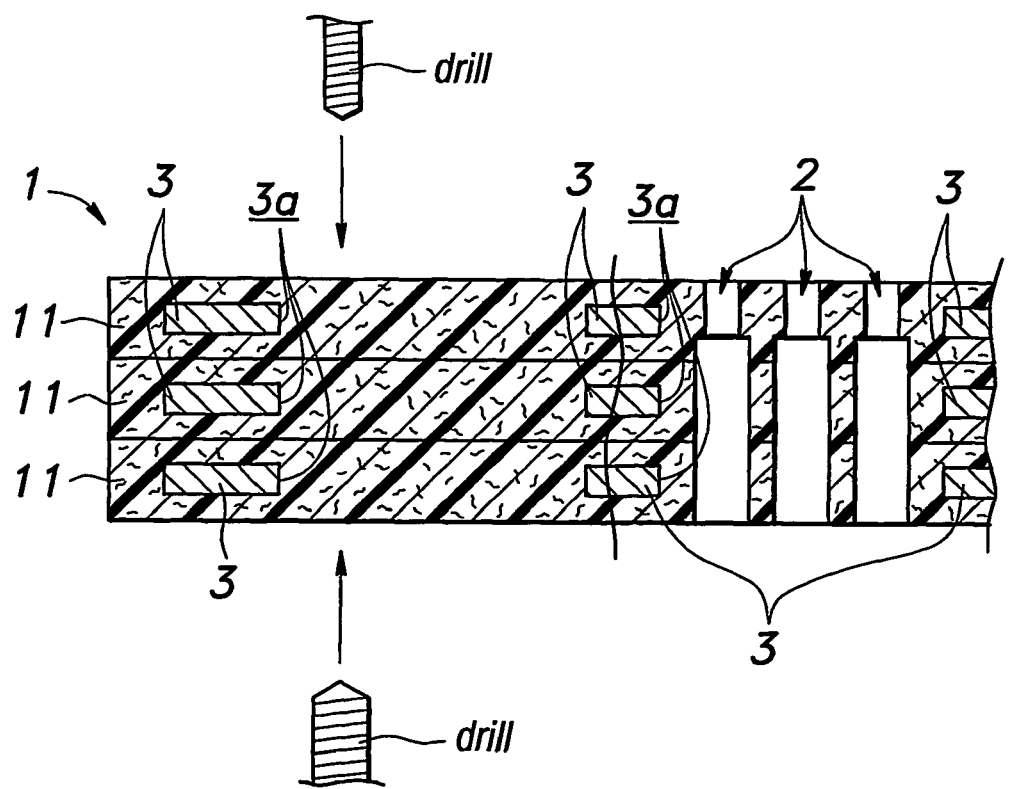
FIG. 10 is a view similar to FIG. 2 showing a fifth embodiment of the present invention.
Figure 11:
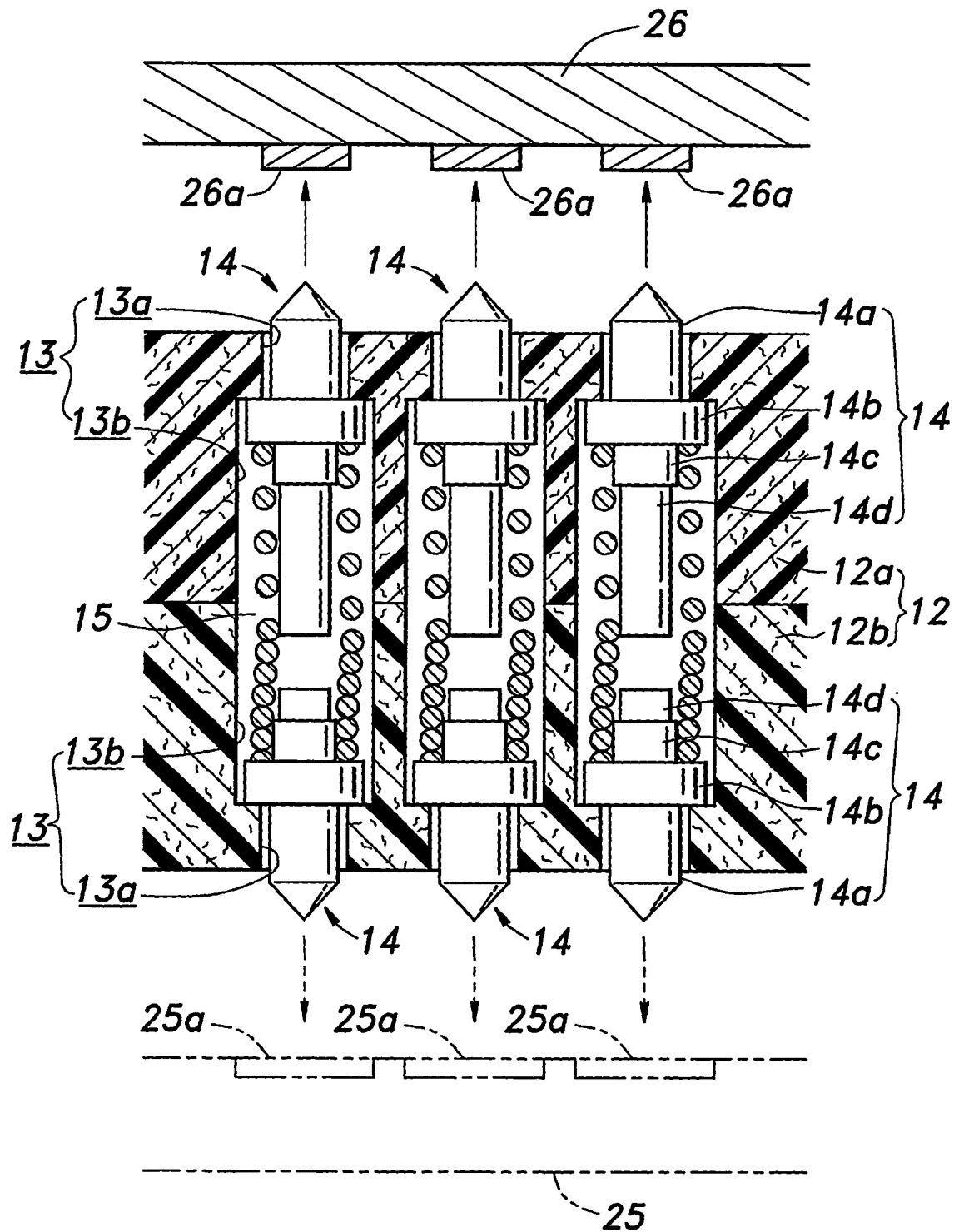
FIG. 11 is a fragmentary sectional side view of the support member assembly and electroconductive contact members based on a sixth embodiment of the present invention partly in section.
Figure 12:
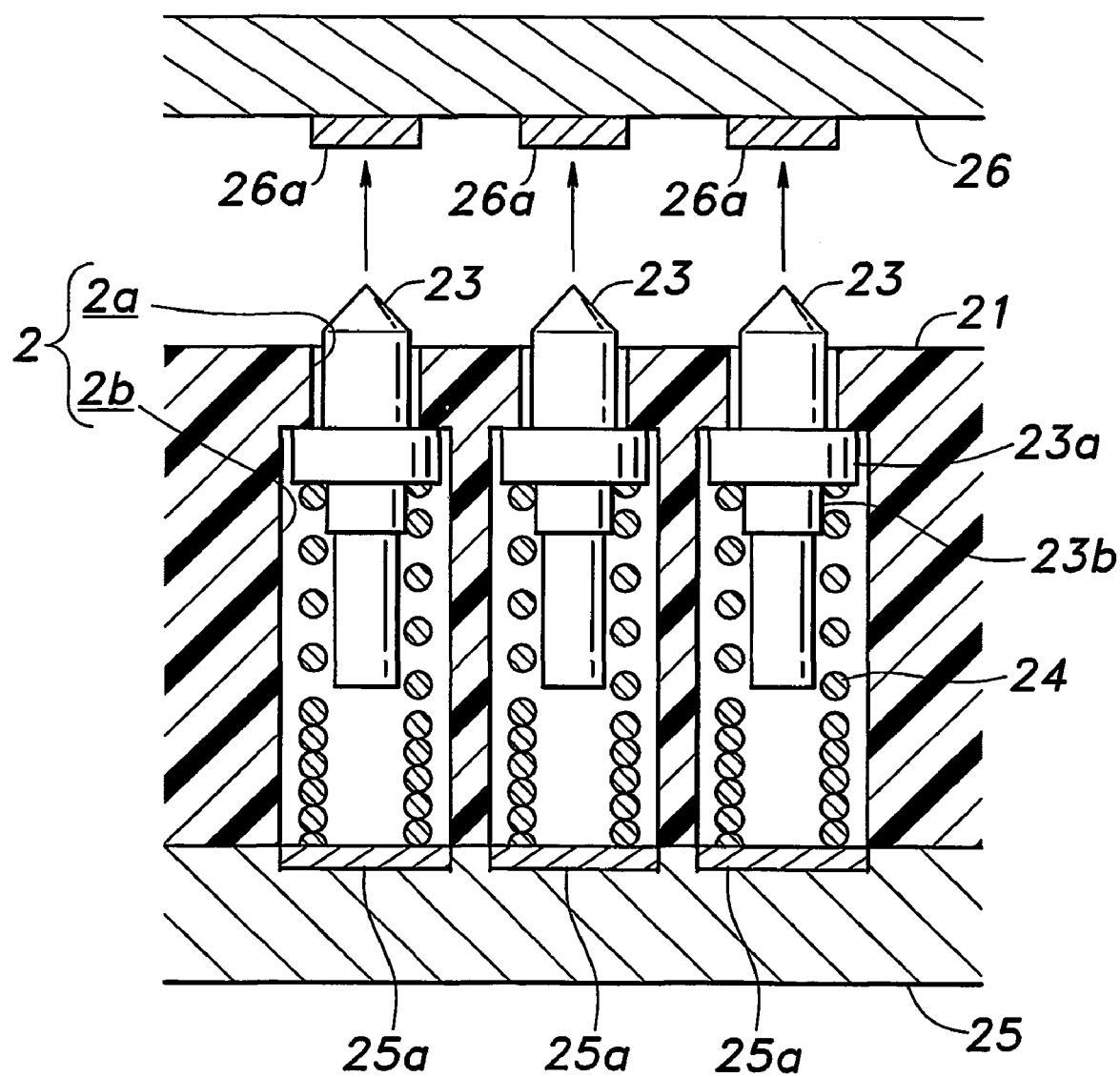
FIG. 12 is a fragmentary sectional side view showing a conventional support member assembly and electroconductive contact members partly in section.

FIG. 10 shows a fifth embodiment of the present invention. The support member assembly 1 of the fifth embodiment is similar to those of the previous embodiments, and FIG. 11 is a view similar to FIG. 2. Therefore, the parts corresponding to those shown in FIG. 2 are denoted with like numerals without repeating the description of such parts.

The plastic layered assembly 11 of the fifth embodiment comprise plastic material consisting of nonwoven fabric impregnated with thermosetting resin, and is incorporated with a reinforcing plate 3. The assembly is then heated or heated and pressurized to be formed into a plate member in a similar manner as the first embodiment. The material for the nonwoven fabric may be selected from glass fibers, carbon fibers and silica fibers according to the particular application. In any case, the fibers are finer and shorter than those of prepreg and glass fiber reinforced epoxy resin (which consists of base fabric woven by using strands of long glass fibers as the warp and impregnated with epoxy resin). In view of the elevated temperature and the need for a high mechanical strength (to prevent the warping or deformation of the parts of the reinforcing plate located between adjacent openings), glass fibers are preferred.

Thus, when a laminated assembly of plastic layered assemblies shown in the left side of the drawing is drilled to form the holder holes as shown in the right side of the drawing, because the nonwoven fabric contained in each plastic layered assembly that needs to be drilled, are shorter and finer than those used in prepreg and glass fiber reinforced epoxy resin, deviation of the tip of the drill due to the interferences by the fibers can be avoided. This is particularly true when the fibers of the nonwoven fabric is made of glass fibers. Therefore, as compared to the case where prepreg or glass fiber reinforced epoxy resin is used, there is no reduction in the mechanical strength and the machining precision so that the precision in the pitch of the electroconductive contact members can be maintained at a high level, and a precision required for testing semiconductor devices and related component parts can be ensured even under an elevated temperature.

FIG. 11 shows a sixth embodiment of the present invention. The support member assembly 12 of the sixth embodiment is formed by laying over a pair of members 12a and 12b over each other. These two members 12a and 12b are joined by threaded bolts so that they may be separated from each other when necessary for maintenance purposes.

The two members 12a and 12b are each provided with stepped holder holes 13 extending across the thickness thereof. When the two members 12a and 12b are joined to each other, the small diameter sections 13a of the holder holes 13 face the outside while the large diameter sections 13b adjoin and align with each other as shown in the drawing. Each of the small diameter sections 13b slidably receives a needle part 14a of an electroconductive contact member 14, and each of the large diameter sections 13a receives an electroconductive coil spring 15 in slightly compressed state.

Each electroconductive contact member 14 comprises a radial flange 14b larger than the small diameter section 13a and received in the large diameter section 13b, a small diameter boss portion 14c projecting from the radial flange 14b away from the needle part 14a, and a stem portion 14d smaller than the boss portion 14c in diameter and projecting from the boss portion 14c, each disposed coaxially with the needle portion 14a and provided with a circular cross section. The stem portion 14d of the upper electroconductive contact member 14 (or the side adapted to contact the corresponding electrode 26a of the wafer 26) is longer than the stem portion 14d of the lower electroconductive contact member 14.

The electroconductive coil spring 15 may be plated with gold, and provided with a coarsely wound section at one end thereof and a closely wound section at the other end thereof each having a prescribed length. Each coil end is fitted onto the boss portion 14c of the corresponding electroconductive contact member 14. The tightness of the fit may be such that the tightening force of the coil spring 15 is adequate for the coil spring 15 and two electroconductive contact members 14 to be kept in one piece in a partly assembled state. Thereby, the handling of the assembly during the assembly work is facilitated. Also, the maintenance work is simplified because each electroconductive contact member may be disengaged from the electroconductive coil spring 15 simply by twisting it in the direction to unwind the coil spring 15.

The two members 12a and 12b were arranged symmetric to each other in the illustrated embodiment, but the present invention is not limited by such an embodiment. The two members 12a and 12b were placed one over the other in the illustrated embodiment, but three or more members may also be used including a three-layered structure having an intermediate member interposed between two members 12a and 12b.

An electroconductive contact head having two moveable ends is formed in this manner. According to this structure, each electroconductive contact member 14 is prevented from coming off with the radial flange 14b thereof engaged by the shoulder portion defined between the small diameter section 13a and large diameter section 13b, and a certain pre-stress is produced in each electroconductive contact member 14 by the electroconductive coil spring 15 compressed by a prescribed amount. The needle part 14a of the lower electroconductive contact member 14 resiliently engages a corresponding terminal 25a of the circuit board 25 which is placed over the support member assembly 12 in a per se conventional manner.

The electroconductive coil spring 15 is compressed by a prescribed amount in the illustrated assembled state, and the length of the projecting stem portion 14d of the boss portion 14c of the upper electroconductive contact member 14 is selected in such a manner that the projecting stem portion 14d engages an end of the closely wound section of the electroconductive coil spring 15. Thereby, even when the heights of the opposing electrodes are uneven due to manufacturing errors and the depressing strokes of some of the electroconductive contact members 14 are relatively small, the electric current can be conductive through the closely wound section without fail, and the resistance of the conductive path can be controlled to a stable and low level without conducting the electric current along a spiral path. Such a state of contact may be achieved when the circuit board 25 is assembled.

The two members 12a and 12b are not required to be made of a same material. For instance, a combination of a plastic material consisting of nonwoven fabric impregnated with thermosetting resin and a different material such as ceramic, glass wafer or a plastic material such as LCP, PES, PEI and PAI may also be used. By so doing, an optimum arrangement can be achieved so as to suit the particular operating environment (room temperature, about 80° C. and 150° C. and different pitches of the electrodes 26a. The temperature levels of 80° C. and 150° C. are only exemplary, and the present invention is not limited to such temperature but is applicable to tests at any temperature between the room temperature to about 150° C.

Possible combinations are described in the following by taking an example of the two-layer structure of the illustrated embodiment. When the operating temperature is 150°

C., the wafer side member (member 12a in the illustrated embodiment) is made of ceramic material, and the circuit board side member (member 12b in the illustrated embodiment) consists of plastic material containing glass fibers or fillers (such as strips and beads of fibers) incorporated with a reinforcing plate (the assembly based on the first embodiment, for instance). The side of the high temperature wafer is therefore made of heat resistant material, and adapted for high temperatures and small pitches. The side of the circuit board consists of a composite structure as described above which is incorporated with a reinforcing plate to ensure an adequate mechanical strength even at an elevated temperature, and is easy to machine.

When the operating temperature is approximately 80° C., the wafer side may consist of a composite structure consisting of plastic material containing glass fibers or other fillers incorporated with a reinforcing plate while the circuit board side is made of plastic material containing glass fibers or other fillers without any reinforcing plate. Even with such a structure, the necessary precision can be maintained in spite of temperature changes, and the manufacturing cost can be reduced by the factor of 35/90 as compared with the ceramic support member assembly.

When the operating temperature is room temperature, the wafer side may consist of plastic material only while the circuit board side is made of plastic material containing glass fibers or other filler without using any reinforcing plate. In such a case, the cost can be reduced by the factor of 20/90 as compared with the ceramic support member assembly.

The foregoing embodiments are only exemplary and various other combinations are also possible depending on the temperature condition and the pitch of the electroconductive members.

Thus, according to the present invention, the overall mechanical strength of the support member assembly can be increased by using a reinforcing member, and a number of such reinforcing plates can be laminated one other another so that each reinforcing plate may be provided with a small thickness. When each reinforcing plate is provided with a small thickness, the strips of the reinforcing plate between adjacent openings can be worked without any difficulty, and the manufacturing cost can be thereby reduced.

In particular, when the support member assembly is formed by laminating a number of plastic layered assemblies each incorporated with a reinforcing plate, each plastic layered assembly may be formed as a thin plate, and the dimensional precision of each plastic layered assembly as well as the precision of the laminated support member assembly can be achieved without any difficulty. Even when each plastic layered assembly does not have an adequate thickness, a desired thickness can be achieved by laminating a number of such plastic layered assemblies. By forming a plastic layered assembly by laminating a plurality of plastic sheets onto a reinforcing plate, the dimensional precision of the plastic layered assembly can be improved and a desired thickness can be achieved without any difficulty because the assembly is formed by laminating even thinner plastic plate members.

When each plastic layered assembly comprises plastic material formed by impregnating nonwoven fabric with thermosetting resin, the support member assembly can be formed by heating or heating and pressurizing the plastic layered assemblies. Because nonwoven fabric consists of relatively short and fine fibers, the driling of holder holes for receiving electroconductive contact members can be more favorably and economically performed as compared to prepreg and fiber glass reinforced epoxy resin. This contributes to the simplification of the machining work and the reduction in the manufacturing cost. Because deviation of the tip of the drill due to the interferences by the fibers can be avoided, a highly precise drilling work can be performed on a support member assembly having a high mechanical strength. Therefore, the support member assembly can be used even when the electrodes of the semiconductor devices and related components that need to be accessed are arranged in a finer pitch.

The mechanical strength of the support member assembly can be ensured with a simple structure if a plastic plate member is prepared as a part for forming the holder holes of the electroconductive contact members and fixedly attaching an annular reinforcing member to the outer periphery of the plastic plate member.

By forming the support member assembly by using nonwoven fabric impregnated by thermosetting resin or by laminating a plurality of members each comprising nonwoven fabric impregnated by thermosetting resin, an adequate mechanical strength of the support member assembly can be ensured without requiring a reinforcing member. In this case also, holder holes can be favorably formed in a similar fashion. By making some of the members from ceramic material, glass wafer or plastic material such as LCP, LES, PEI or PAI, a support member assembly having an optimum combination of materials can be achieved depending on the environmental temperature (from room temperature to 150° C.) and the required precision of the pitch of the electroconductive contact members (tolerable deviations of the electroconductive contact members for a given pitch of the terminals of the object to be tested).

Although the present invention has been described in terms of preferred embodiments thereof, it is obvious to a person skilled in the art that various alterations and modifications are possible without departing from the scope of the present invention which is set forth in the appended claims.

The invention claimed is:

1. A support member assembly for supporting a plurality of electroconductive contact members for accessing an object to be contacted in a mutually parallel relationship, comprising:
   a plastic plate member; and
   a plurality of reinforcing plates incorporated in said plate member one over another and each provided with at least one opening which registers with an opening of an adjacent one of said reinforcing plates, said reinforcing plates being at least partly buried within said plastic plate member so that the material of said plastic plate member fills the openings of said reinforcing plates;
   part of said plastic plate member corresponding to said at least one opening of said reinforcing plates being formed with a plurality of holder holes for receiving said electroconductive contact members extending across the thickness thereof.

2. A support member assembly for supporting a plurality of electroconductive contact members according to claim 1, wherein said reinforcing plates are closely placed one over another.

3. A support member assembly for supporting a plurality of electroconductive contact members for accessing an object to be contacted in a mutually parallel relationship, comprising:
   a plastic plate member incorporated with nonwoven fabric therein, said plastic plate member being formed with a plurality of holder holes for receiving electroconductive contact members extending across the thickness thereof; and a plurality of reinforcing plates incorporated in said plastic plate member and provided with at least one opening corresponding to a part of said plastic plate where said plurality of holder holes are formed, said reinforcing plates being at least partly buried within said plastic plate member so that the material of said plate member fills the openings of said reinforcing plates.

4. A support member assembly for supporting a plurality of electroconductive contact members according to claim 3, wherein said nonwoven fabric comprises glass fibers.

5. A support member assembly for supporting a plurality of electroconductive contact members according to claim 3, wherein said plastic plate is made of thermosetting resin.

6. A support member assembly for supporting a plurality of electroconductive contact members for accessing an object to be contacted in a mutually parallel relationship, comprising:
   a plastic plate member; and
   a plurality of parallel reinforcing plates, each reinforcing plate including at least one opening which registers with an opening of an adjacent opening of an adjacent reinforcing plate, wherein said plurality of reinforcing plates are at least partially embedded within said plastic plate member such that the material of said plastic plate member fills the openings of said reinforcing plates;
   wherein each opening in the plurality of parallel reinforcing plates includes a plurality of holder holes formed in said plastic plate member for receiving said electroconductive contact members.

7. The support member assembly of claim 6, wherein said reinforcing plates are spaced from each other.

8. The support member assembly of claim 6, wherein each of said plurality of reinforcing plates is in contact with at least one adjacent reinforcing plate.

9. The support member assembly of claim 6, wherein said plastic plate member comprises a nonwoven fabric.

10. The support member assembly of claim 9, wherein said nonwoven fabric comprises glass fibers.

11. The support member assembly of claim 9, wherein said plastic plate comprises a thermosetting resin.

12. The support member assembly of claim 6, wherein:
   each reinforcing plate includes a plurality of openings, each opening registering with an opening of an adjacent opening of an adjacent reinforcing plate and including a plurality of holder holes.

* * * * *